(12) United States Patent
Hong

(10) Patent No.: US 6,469,953 B1
(45) Date of Patent: Oct. 22, 2002

(54) LATCH CIRCUIT

(75) Inventor: Joseph N. Hong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/925,148

(22) Filed: Aug. 8, 2001

(51) Int. Cl.[7] .................. G11C 8/00; H03K 19/094
(52) U.S. Cl. ..................... 365/230.08; 365/230.06; 326/98; 326/121
(58) Field of Search ................. 365/230.08, 230.06; 326/95, 97, 98, 121

(56) References Cited

U.S. PATENT DOCUMENTS

| | | | |
|---|---|---|---|
| 5,146,115 A | | 9/1992 | Benhamida ............... 307/452 |
| 5,822,252 A | * | 10/1998 | Lee et al. ................ 365/185.23 |
| 5,896,046 A | | 4/1999 | Bjorksten et al. ............. 326/98 |
| 6,021,088 A | * | 2/2000 | Kim ....................... 365/189.05 |
| 6,060,909 A | | 5/2000 | Aipperspach et al. ......... 326/98 |
| RE36,821 E | * | 8/2000 | Casper et al. ............ 365/189.01 |
| 6,130,855 A | * | 10/2000 | Keeth ........................ 365/195 |

OTHER PUBLICATIONS

J.N. Hong, "Set–Dominant Latch", Intel Corporation, m4sdla, Feb. 7, 2001.

* cited by examiner

*Primary Examiner*—Son Mai
(74) *Attorney, Agent, or Firm*—Fish & Richardson P.C.

(57) ABSTRACT

A domino-logic latch device may include a domino-logic block formed, e.g., of a transistor and a static inverter, a precharge transistor configured to precharge a sensing node to a precharge logic level, a logic block arranged between the sensing node and an intermediate node, and configured to receive one or more input signals to be evaluated during a predetermined interval, a latching transistor, arranged between the sensing node and the intermediate node and configured to latch an evaluated logic level of the logic block during the predetermined interval, and a discharge transistor, coupled to the intermediate node, configured to conditionally discharge the sensing node to a discharge logic level based on the input signals evaluated by the logic block.

38 Claims, 4 Drawing Sheets

LATCH CIRCUIT

BACKGROUND

The present application relates to a latch, for example, such as used in a domino-logic address decoding circuit.

Domino logic is a type of sequential circuitry used, for example, in CMOS (Complementary Metal Oxide Silicon) logic applications such as VLSI (Very Large Scale Integration) semiconductor design. Typically, a domino logic circuit is formed of a cascaded set of dynamic logic elements in which each stage evaluates and causes the next stage to evaluate, similar to the manner in which each domino in a row topples its neighbor. As a result, a single clock can be used to precharge and evaluate a cascaded set of dynamic logic circuits.

As shown in FIG. 1, a conventional CMOS domino-logic circuit 100 may be formed of two different blocks: a dynamic CMOS block 102 and a domino logic block 104. The dynamic CMOS block 102, in turn, is formed of a precharge transistor 103 (e.g., a p-type transistor) that is configured to precharge a sensing node 101 during the precharge clock phase (e.g., CLK=0) to a predetermined logic level (e.g., $V_{DD}$ or high), a logic block 105 (e.g., formed of n-type devices) that receives and evaluates inputs, and a discharge transistor 107 (e.g., an n-type transistor) that, during the evaluate clock phase (e.g., CLK=1) and depending on the make-up of logic block 105 and the inputs that it receives, conditionally discharges the sensing node 101 to another logic level (e.g., $V_{SS}$ or low). The domino block 104 typically is formed of a transistor 109 (e.g., a p-type device) and a static inverter 111.

As an alternative to the transistor types shown in FIG. 1, a n-type transistor that precharges the sensing node to $V_{SS}$ could be used as precharge transistor 103, a p-type transistor that conditionally discharges the sensing node 101 to $V_{DD}$ could be used as discharge transistor 107, and an n-type transistor could be used in place of domino block transistor 109, in which case the logic block 105 may be formed of p-type devices.

Domino logic frequently is used in decoders. Decoders often are used to select an appropriate portion of a computer memory (e.g., at which a read or write operation is to be performed) depending upon the particular address input to the decoder.

DRAWING DESCRIPTIONS

Details of one or more embodiments are set forth in the accompanying drawings and the description below. Other features and advantages will be apparent from the description and drawings, and from the claims.

DETAILED DESCRIPTION

The design of a static random access memory (SRAM) architecture typically uses pipelining, for example, to increase access frequency and data throughput. In general, pipelining in a memory circuit is a technique where new addresses are decoded in one stage while the memory bits are being accessed in another stage. Because the two events occur substantially simultaneously, instead of serially, higher operation cycle frequencies may be facilitated.

A pipelined SRAM design typically will have latches—devices that temporarily store a value such as a logic level—between the row decoders and the word line drivers. The present inventor recognized that a pipelined SRAM architecture could be improved, with a corresponding increase in speed, by using a domino-logic latch circuit that catches decoder pulses and enables the decoders to be reset almost immediately after decoding their respective input address signals.

Figure 2:
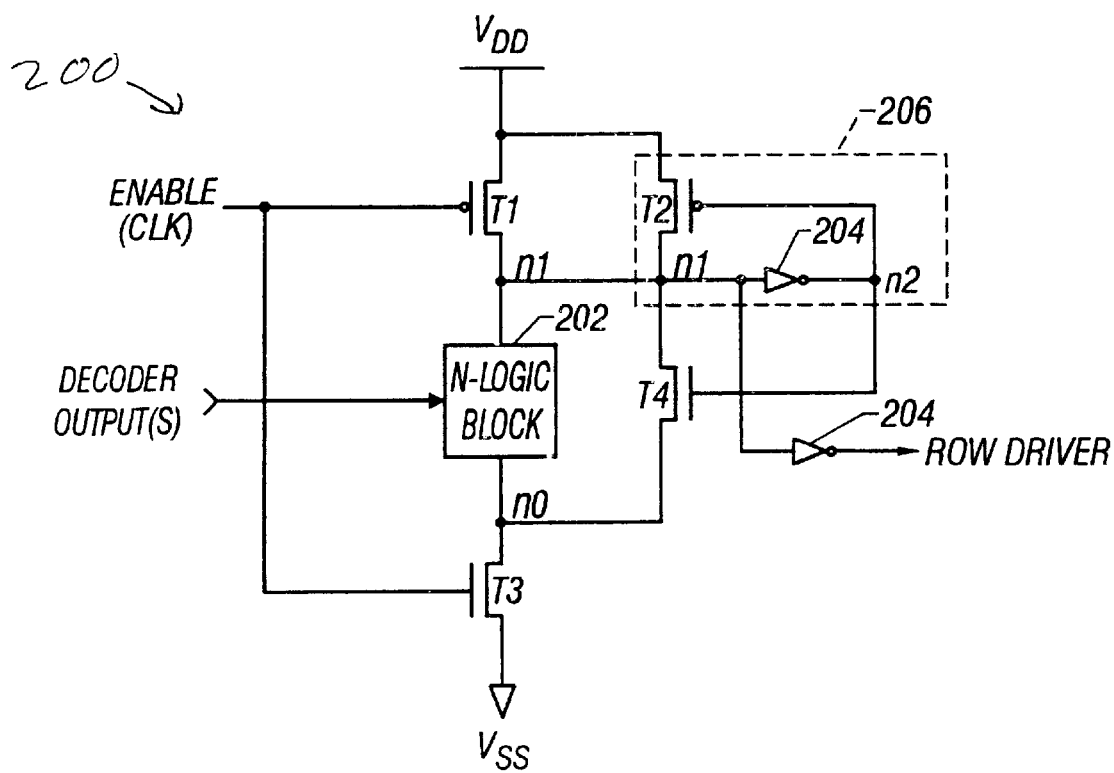
FIG. 2 is a diagram of a CMOS domino-logic latch circuit.

FIG. 2 is a diagram of a decoder pulse-catching CMOS domino-logic latch circuit 200. As shown therein, the latch circuit 200 may include a p-type precharge transistor T1 and an n-type discharge transistor T3, the gates of both of which may be driven by an Enable signal such as a memory clock signal (CLK). An n-logic block 202, which may receive as input one or more decoder's output, may be arranged between the sensing node n1 (coupled with the drain of p-type transistor T1) and an intermediate node n0 (coupled with the drain of n-type transistor T3). The logic block 202 may include one or more n-type devices or other logic components to implement virtually any desired logic function. In a canonical form of the latch circuit 200, the logic block 202 includes only a single n-type transistor that receives a single decode signal as input, which is used to drive its gate.

The latch circuit 200 also may include a domino logic block 206 formed of a p-type transistor T2, arranged in parallel with transistor T1, and a static inverter 204 coupled between the sensing node n1 and the gate of transistor T2 at node n2. In addition, the latch circuit 200 may include an n-type latching transistor T4, which has its drain coupled with the sensing node n1, its source coupled with intermediate node n0 and its gate driven by node n2. Optionally, the latch circuit 200 also may include an output inverter 204, which taps off of the sensing node n1 and provides an output to an associated row driver. Although the output inverter 204 provides essentially the same logic signal as is present at node n2, it may be desirable to buffer the row driver signal in this manner to minimize noise on the row driver output.

Figure 1:
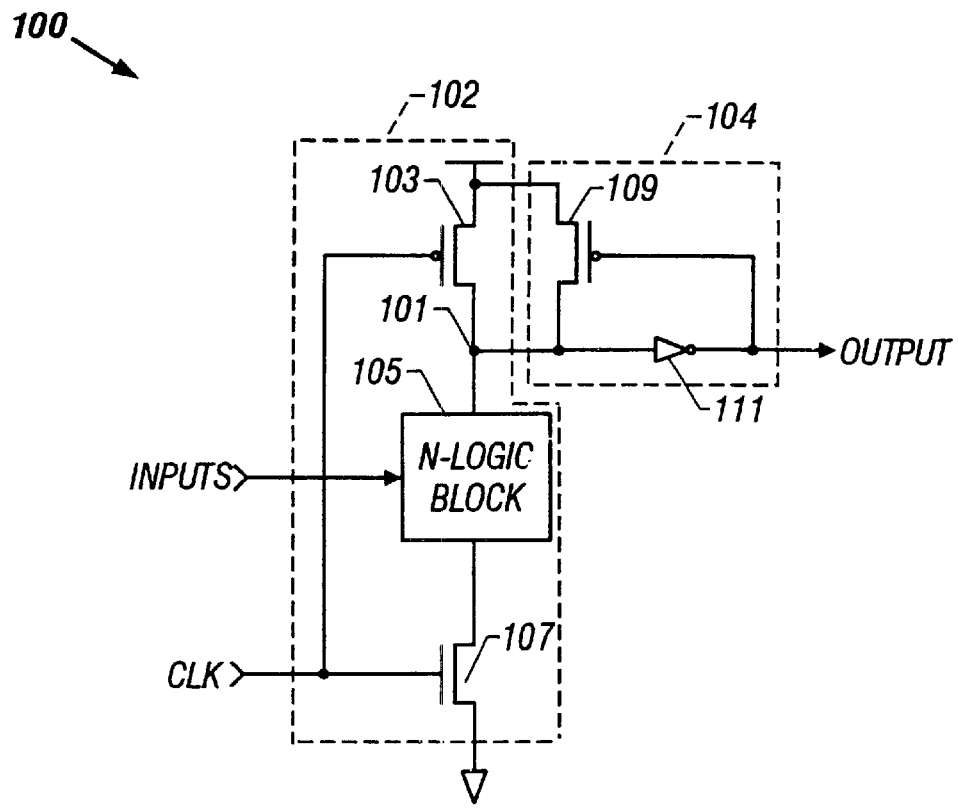
FIG. 1 is a diagram of a conventional CMOS domino-logic circuit.

As discussed above with respect to FIG. 1, an alternative implementation of the latch circuit 200 may be realized essentially by substituting p-type devices for n-type devices and vice versa, switching $V_{DD}$ to $V_{SS}$ and vice versa, and/or making any other appropriate design and level adjustments.

In operation of the latch circuit 200, transistor T1 precharges the sensing node n1 to a high state during the precharge phase. During precharge (CLK=0), transistors T1 and T2 are "ON" (i.e., conducting), transistors T3 and T4 are "OFF" (i.e., non-conducting), sensing node n1 becomes high, node n2 and the row driver output become low, intermediate node n0 is floating, and the state of the logic block 202 is, by design convention, OFF.

When Enable goes high (CLK=1) at the setup for evaluation, transistor T1 shuts OFF thereby isolating sensing node n1 from $V_{DD}$, and transistor T3 turns ON, thereby pulling intermediate node n0 to $V_{SS}$. The respective states of transistors T2 and T4 and nodes n1 and n2 are not affected at this time. In this state, the latch circuit 200 is ready to capture one or more decoder pulses applied to logic block 202 during the evaluation phase.

Next, the decoder outputs to the logic block 202 are evaluated to produce a decoded logic state (e.g., either conducting or non-conducting). As a result, sensing node n1 may be conditionally discharged to $V_{SS}$ depending on the number and arrangement of n-type devices in logic block 202 and the decoder output(s) received. Assume, for example, that the canonical form of the latch circuit is being used, meaning that logic block 202 is formed of a single n-type transistor, and that logic block 202 receives as input a single high-level decoder output. In that case, the single n-type transistor in logic block 202 would turn ON and logic block 202 would be in a conducting state—that is, it would appear as a short circuit between nodes n1 and n0. Because transistor T3 previously was turned on by the high-level Enable signal, the sensing node n1 would discharge to $V_{SS}$. Consequently, domino transistor T2 would shut OFF, and latching transistor T4 would turn ON, thereby latching the decoded logic state of logic block 202. Specifically, in this example, transistor T4 would latch the information applied during evaluation that logic block 202 decoded to a logic state that rendered logic block 202 conducting, and thereby causing sensing node n1 to discharge to $V_{SS}$. Once transistor T4 has latched the decoded logic state of logic block 202, the decoder outputs are no longer needed and, as a result, the upstream decoding circuitry that generated the decoder outputs can be reset.

The pulse-catching domino-logic latch of FIG. 2 may provide several advantages. For example, by latching the decoded state of the logic block into which the decoder outputs are fed, the upstream decoder stream may be reset almost immediately. In particular, the decoder outputs applied to the logic block need to be held high only long enough for the latching transistor to turn on—potentially as short as 100 picoseconds or less. After that time, the decoding circuitry can be reset to accommodate the next set of address inputs. As a result, the overall decoder design may be simplified and streamlined for pipeline operation. In other words, the latch circuit of FIG. 2 may enable the decoder outputs to be decoupled from the Enable signal.

More generally, the pulse-catching domino-logic circuit of FIG. 2 may be advantageous in building a high-speed, pipelined decoder and word line driver array. Moreover, the latch circuit of FIG. 2 may be suitable for high-density SRAM designs, it interfaces well with domino design styles, is elegantly simple, and is compact in area.

Figure 3:
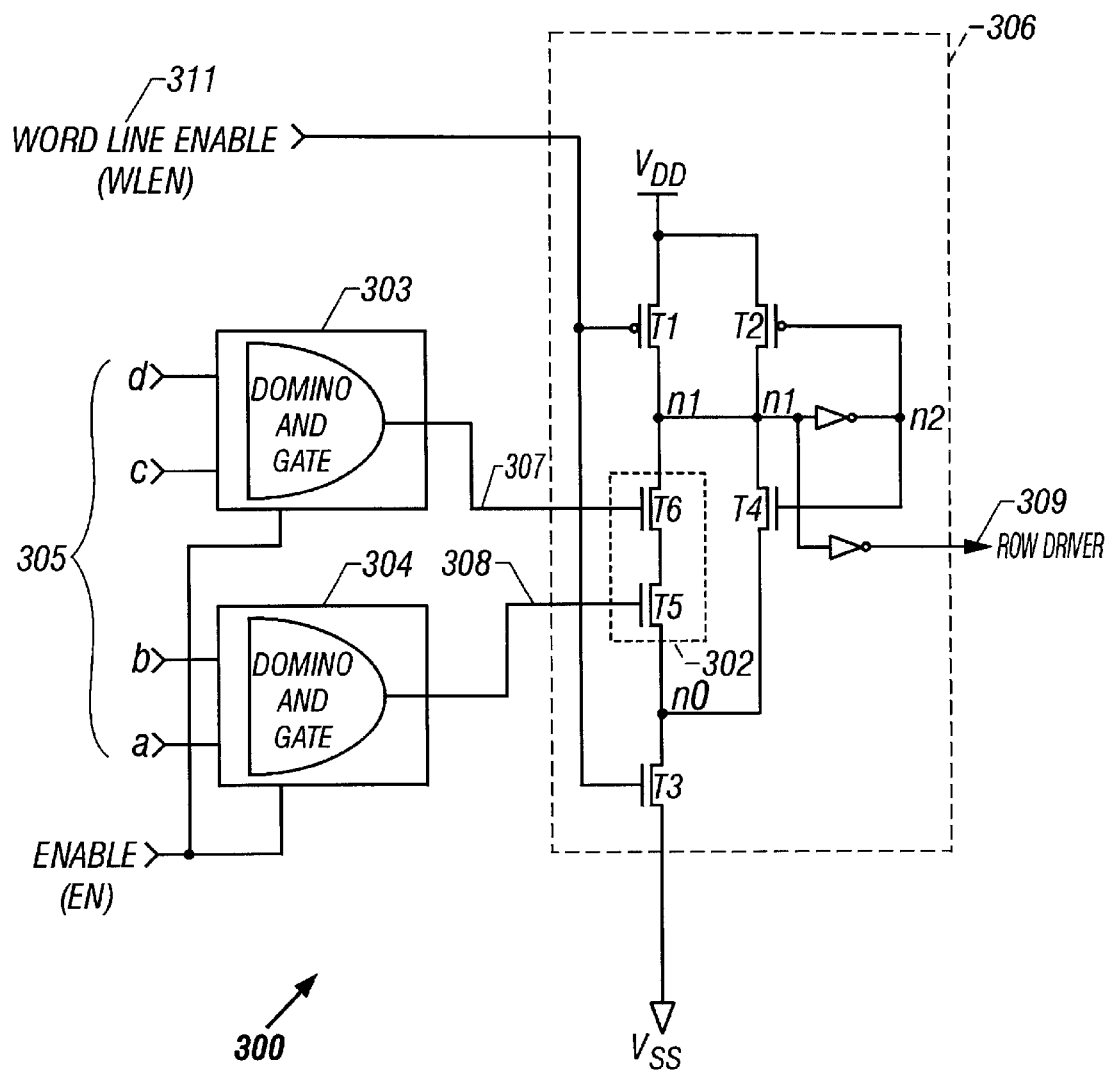
FIG. 3 is a diagram of an exemplary decoder circuit including CMOS domino-logic decoders and a CMOS domino-logic latch circuit.

FIG. 3 shows an example of a decoder circuit 300 that includes two CMOS domino-logic decoders 303, 304, and a CMOS domino-logic latch circuit 306. In this example, each of decoders 303, 304 decodes two input address signals (<a,b> or <c,d>) and is enabled by an Enable signal (EN), which is activated when the inputs applied to the decoder are to be decoded. Operation of the latch circuit 306 is controlled by the word line enable (WLEN) signal 311.

Figure 4:
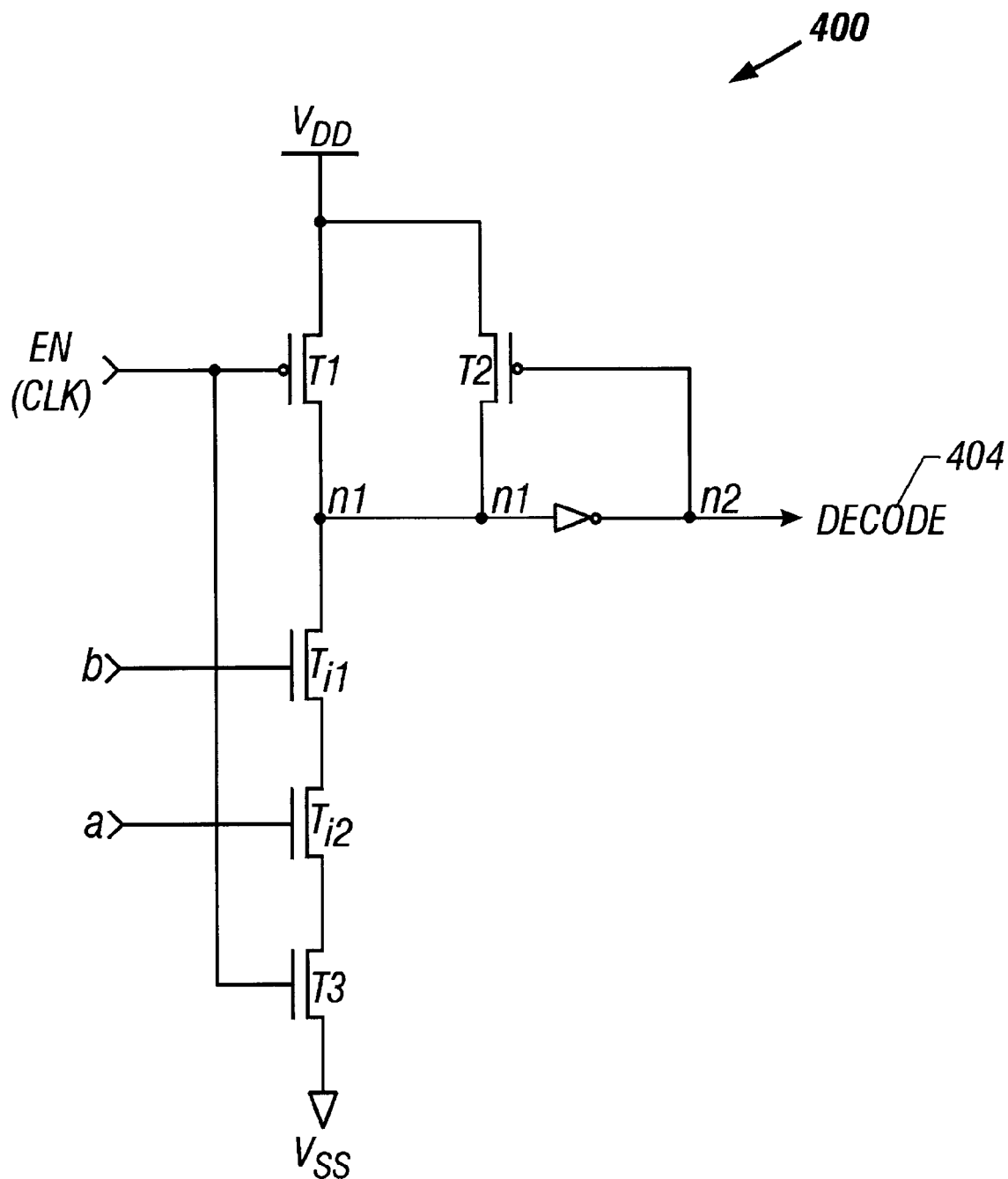
FIG. 4 is a diagram of a CMOS domino-logic decoder.

FIG. 4 is a diagram of a domino-logic AND gate that may serve as either or both of the decoders 303, 304 shown in FIG. 3. As shown in FIG. 4, the address signal inputs <a,b> are decoded respectively by n-type transistors $T_{i1}$ and $T_{i2}$. Sensing node n1 is precharged to $V_{DD}$ during the precharge phase (CLK=0) and is conditionally discharged to $V_{SS}$ if both inputs a and b are high during evaluation (CLK=1). The resulting decode signal 404 is set high if both a and b are high during evaluation but otherwise remains low.

Returning to FIG. 3, the latch circuit portion 306 of the decoder circuit 300 is substantially the same as the pulse-catching domino-logic latch shown in FIG. 2, except that the logic block 302 includes two n-type transistors T5 and T6, connected in serial, that together implement an AND logic function. As noted above, logic block 302 alternatively could include different and/or additional n-type devices to implement virtually any desired logic function. In the example of FIG. 3, the logic block 302 of latch circuit 306 decodes to a logic state in which logic block 302 is conducting (thereby discharging sensing node n1 to $V_{SS}$) only if both decoder output signals 307, 308 (DEC1 and DEC2, respectively) supplied to logic block 302 are high during the evaluation phase. Otherwise, the sensing node n1 remains high during evaluation and the row driver output 309 remains low (e.g., unselected).

Figure 5:
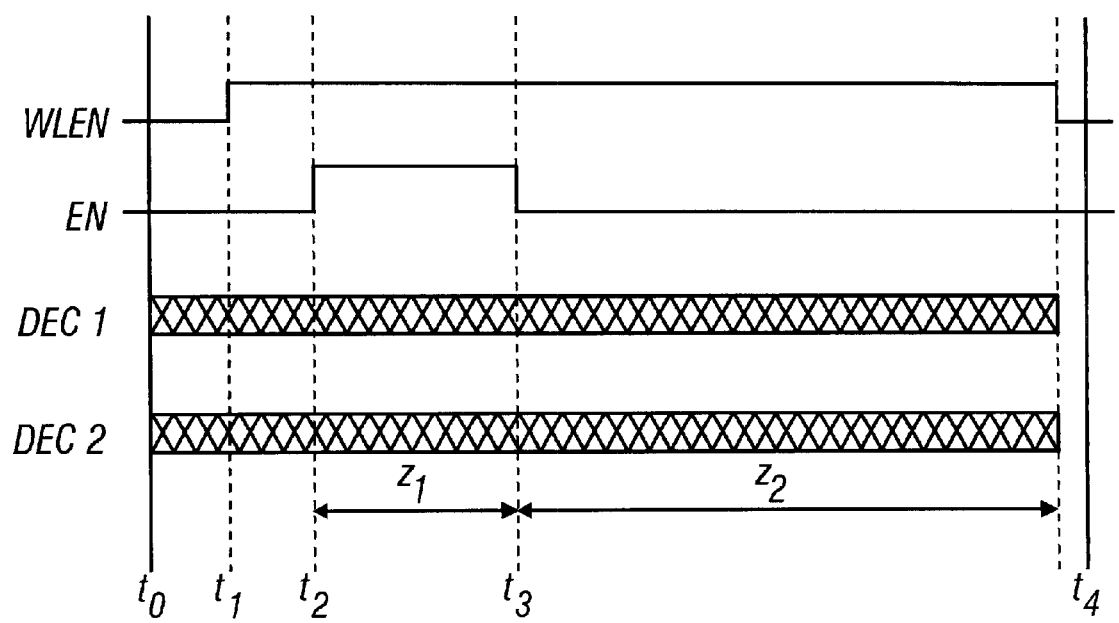
FIG. 5 is an example of a timing diagram showing timing for a CMOS domino-logic decoder circuit of FIG. 3.

FIG. 5 is an example of a timing diagram for the decoder circuit of FIG. 3. As shown therein, the timing diagram begins during the precharge phase at time t0 when both WLEN and EN are low. During this phase, the sensing node n1 is precharged to $V_{DD}$. Next, at time $t_1$, WLEN goes high and the pulse-catching latch 306 becomes ready to capture and latch (by means of latching transistor T4) the decoded state of logic block 302. Next, at time $t_2$, EN goes high meaning that the decoder output signals DEC1 307 and DEC2 308 are ready to be evaluated. EN remains high for delay $Z_1$ until $T_3$ at which time, EN goes low again and the decoders 303, 304 are available to be reset for the next address decoding cycle. As noted above, delay $Z_1$ may be shortened to be only as long as necessary to conditionally turn on latching transistor T4—for example, 100 picoseconds or less. In contrast, WLEN may remain active as long as necessary to process the data being handled, for example, during delay $Z_2$ until time $t_4$ in FIG. 5. During the delay $Z_2$, the decoders feeding the pulse-catching latch may be setting up and/or decoding the next set of memory addresses. In this manner, the operation of WLEN and EN is decoupled thereby enabling the design of a simplified, pipelined SRAM with increased speed and efficiency.

Various implementations of the systems and techniques described here may be realized in digital electronic circuitry, integrated circuitry, specially designed ASICs (application specific integrated circuits), addressable memory devices, embedded memory devices, or in computer hardware, firmware, software, or combinations thereof. In particular, the systems and techniques described here may find applicability in microcontrollers, communications integrated circuits (ICs), wireless ICs, or in virtually any other device that uses external or embedded memory components.

Other embodiments may be within the scope of the following claims.

What is claimed is:

1. A latch device comprising:
   a precharge transistor configured to precharge a sensing node to a precharge logic level;
   a logic block arranged between the sensing node and an intermediate node, and configured to receive one or more input signals to be evaluated during a predetermined interval;
   a latching transistor, arranged between the sensing node and the intermediate node, and configured to latch an evaluated logic level of the logic block during the predetermined interval; and
   a discharge transistor, coupled to the intermediate node, and configured to conditionally discharge the sensing node to a discharge logic level based on the input signals evaluated by the logic block.

2. The device of claim 1 wherein the logic block comprises one or more logic components.

3. The device of claim 2 wherein at least one of the logic components comprises a transistor.

4. The device of claim 1 further comprising a domino-logic block comprising a transistor and an inverter coupled in parallel with the precharge transistor.

5. The device of claim 4 wherein an output of the domino-logic block drives the latching transistor.

6. The device of claim 1 wherein the precharge transistor comprises a p-type device, each of the latching and discharge transistors comprises an n-type device, and the logic block comprises one or more n-type devices.

7. The device of claim 1 wherein the precharge transistor comprises an n-type device, each of the latching and discharge transistors comprises a p-type device, and the logic block comprises one or more p-type devices.

8. The device of claim 1 wherein the logic block comprises one or more components configured to perform a logical AND function for a plurality of decoder outputs received as input signals.

9. The device of claim 8 wherein the latching transistor latches a result of the logical AND function.

10. The device of claim 1 wherein the latching transistor is configured such that the evaluated logic level latched during the predetermined interval remains latched after the predetermined interval has lapsed.

11. The device of claim 10 wherein the evaluated logic level remains latched by the latching transistor during an evaluation phase.

12. A latch for a memory row driver, the latch comprising:
    a logic block configured to receive as input one or more memory row decoder signals and to evaluate the received decoder signals during a first portion of an evaluate phase to generate an evaluated logic level; and
    a latching component configured to latch the logic block's evaluated logic level during the first portion of the evaluate phase and to maintain the latched logic level during a second portion of the evaluate phase after the first portion has lapsed.

13. The latch of claim 12 further comprising a domino-logic block.

14. The latch of claim 13 wherein an output of the domino-logic block drives the latching component.

15. The latch of claim 12 wherein the logic block comprises one or more components configured to perform a logical AND function for a plurality of memory row decoder signals received as input.

16. The latch of claim 12 further comprising a sensing node configured to be precharged during a precharge phase occuring prior to the evaluate phase and to be conditionally discharged based on the logic block's evaluated logic level, wherein the latching component is configured to maintain the sensing node's logic level during the second portion of the evaluate phase.

17. The latch of claim 16 further comprising a buffer component, coupled with the sensing node, configured to provide a memory row driver output signal based on the sensing node's logic level.

18. A method of latching a row driver signal in a memory architecture, the method comprising:
    resetting, upon occurrence of a word line enable signal, a latch circuit configured to latch a row line driver output;
    latching, while a decoder enable signal is active, an evaluated decoder logic level corresponding to one or more row decoder signals; and
    maintaining the latched evaluated decoder logic level for a period of time after the decoder enable signal has become inactive.

19. The method of claim 18 further comprising providing the latched evaluated decoder logic level to a memory row driver.

20. The method of claim 19 further comprising ceasing to maintain the latched value upon termination of the word line enable signal.

21. The method of claim 18 wherein resetting the latch circuit comprising precharging a sensing node of the latch circuit.

22. The method of claim 18 further comprising, prior to latching, evaluating the one or more row decoder signals to generate the evaluated decoder logic level.

23. The method of claim 18 further comprising resetting row decoder circuitry that generates the one or more row decoder signals while the latched evaluated decoder logic level is being maintained.

24. A static random access memory (SRAM) decoder comprising:
    a plurality of domino-logic decoder elements each configured to decode at least a portion of an SRAM address;
    a plurality of domino-logic latch devices, each latch device coupled with one or more domino-logic decoder elements, each domino-logic latch device comprising:
        a precharge transistor configured to precharge a sensing node to a precharge logic level;
        a domino-logic block arranged in parallel with the precharge transistor and configured to facilitate domino-logic operation of the SRAM decoder;
        a logic block arranged between the sensing node and an intermediate node, and configured to receive one or more address input signals to be evaluated during a predetermined interval;
        a latching transistor, arranged between the sensing node and the intermediate node, and configured to latch an evaluated logic level of the logic block during the predetermined interval; and
        a discharge transistor, coupled to the intermediate node, and configured to conditionally discharge the sensing node to a discharge logic level based on the address input signals evaluated by the logic block.

25. The decoder of claim 24 wherein an output of the domino-logic block drives the latching transistor.

26. The decoder of claim 24 wherein the precharge transistor comprises a p-type device, each of the latching and discharge transistors comprises an n-type device, and the logic block comprises one or more n-type devices.

27. The decoder of claim 24 wherein the precharge transistor comprises an n-type device, each of the latching and discharge transistors comprises a p-type device, and the logic block comprises one or more p-type devices.

28. The decoder of claim 24 wherein the logic block comprises one or more transistors configured to perform a logical AND function for a plurality of decoder outputs.

29. The decoder of claim 24 wherein the latching transistor is configured such that the evaluated logic level latched during the predetermined interval remains latched after the predetermined interval has lapsed.

30. The decoder of claim 29 wherein the evaluated logic level remains latched by the latching transistor during substantially an entire evaluation phase.

31. A latch circuit comprising:
    a first logic block to receive an input, the first logic block coupled between a sensing node and an intermediate node;
    a second logic block coupled with the sensing node; and
    a latching block coupled with the intermediate node and the sensing node to capture the received input.

32. The latch circuit of claim 31, wherein the second logic block comprises a domino logic block.

33. The latch circuit of claim 32, wherein the received input comprises an output from a decoder, and wherein the first logic block comprises a single transistor.

34. The latch circuit of claim 32, wherein the latching block comprises a latching transistor.

35. The latch circuit of claim 34, wherein an output of the domino logic block drives the latching transistor.

36. The latch circuit of claim 35, further comprising an output inverter that taps off the sensing node.

37. The latch circuit of claim 36, further comprising a precharge block configured to precharge the sensing node to a precharge logic level.

38. The latch circuit of claim 37, further comprising a discharge block, coupled with the intermediate node, and configured to conditionally discharge the sensing node to a discharge logic level based on the received input evaluated by the first logic block.

* * * * *